United States Patent [19]

Tharrington

[11] 4,390,795
[45] Jun. 28, 1983

[54] A.C. POWER CONTROL FOR INDUCTIVE LOADS

[75] Inventor: Reginald B. Tharrington, Broken Arrow, Okla.

[73] Assignee: Telex Computer Products, Inc., Tulsa, Okla.

[21] Appl. No.: 266,804

[22] Filed: May 26, 1981

[51] Int. Cl.³ .................... G05F 1/64; H02P 13/24
[52] U.S. Cl. ..................... 307/143; 323/235
[58] Field of Search ............... 307/112, 143, 127, 131, 307/52, 83; 323/221, 235

[56] References Cited

U.S. PATENT DOCUMENTS

| | | | |
|---|---|---|---|
| 2,779,897 | 1/1957 | Ellis | 323/221 X |
| 3,890,562 | 6/1975 | West | 323/235 |

*Primary Examiner*—Donald A. Griffin
*Attorney, Agent, or Firm*—Head, Johnson & Stevenson

[57] ABSTRACT

An electronic switching system for inductive loads in A.C. circuits, comprising a triac switch in series with an inductive load such as transformer or motor, etc. across an A.C. voltage. The control voltage for the triac switch is provided by a smaller, lower power triac driver, which has a light emitting diode controlled by an optically isolated transistor. The optically isolated transistor is provided with electrical pulses each a half cycle of voltage by means of a zero crossing detector. Since it is impossible to know precisely what the power factor of the load is, the triggering of the triac driver is provided at zero voltage on both the upward and downward crossing. These pulses, amplified by the transistor, control the triac driver. The load current will lag the voltage by some angle, dependent on the power factor, and the current will stop at its zero point. The triac driver has its control voltage at the zero of voltage and, therefore, has a control ready to ignite the triac as soon as the current in the reverse direction passes to zero.

2 Claims, 2 Drawing Figures

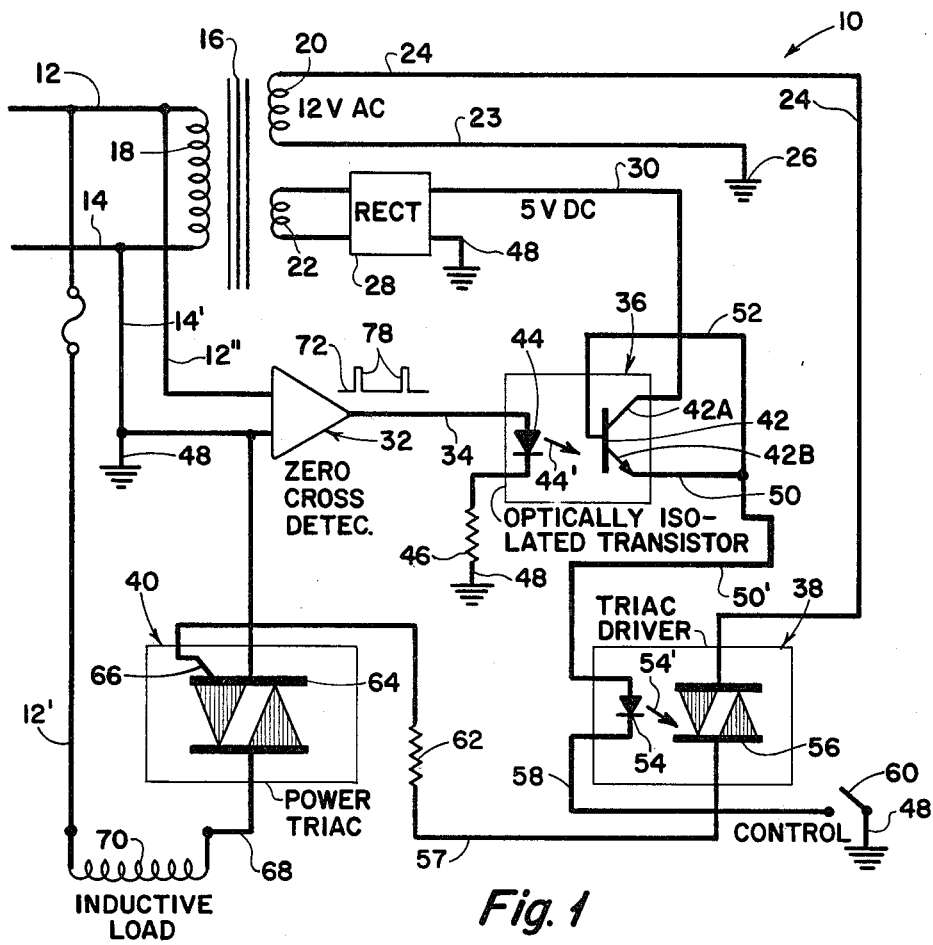
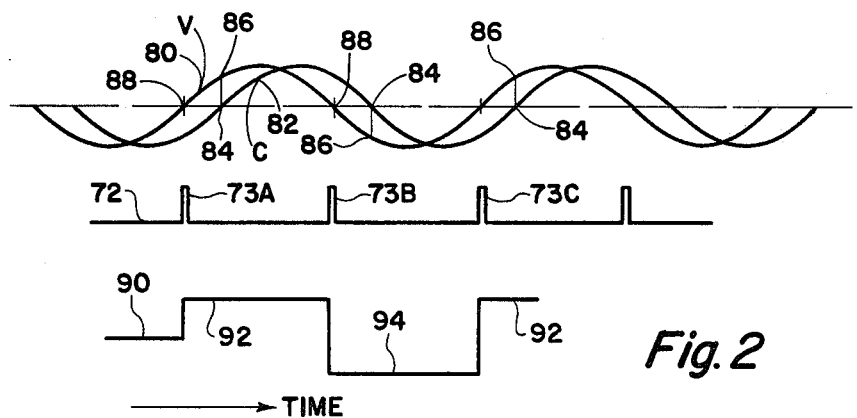
Fig. 1
Fig. 2

A.C. POWER CONTROL FOR INDUCTIVE LOADS

BACKGROUND OF THE INVENTION

1. Field of the Invention

This invention lies in the field of electronic switching means. More particularly, it concerns the control of solid state conduction devices for switching inductive loads into and out of A.C. power circuits.

2. Description of the Prior Art

In the prior art there are a number of examples of circuits which have been proposed over recent years for controlling the electronic switching of A.C. power through inductive loads. Many of these have been unworkable. Others have many disadvantages. For instance, a large proportion of them are very complicated and use bridges in order to determine the proper starting times, etc. Others utilize capacitors, of varying sizes, to adjust the power factor of the load to be substantially resistive. The problem, however, is to know precisely what magnitude of capacitance to use.

In many of these circuits, because of the unsynchronized operation of the thyristor type triac switches, the circuits often provide large transient spikes of voltage or current in the circuits, at the switching times.

SUMMARY OF THE INVENTION

It is a primary object of this invention to provide a solid state switching system for handling inductive loads.

It is a further object of this invention to provide such a switching system which is simple and free of interference from rates of change of current and/or voltage in the circuits.

It is a still further object of this invention to provide such a control circuit of great simplicity and constructed completely from off-the-shelf electronic solid state devices.

These and other objects are realized and the limitations of the prior art are overcome in this invention by providing a triac type of switching means. The triac switch is a commercial device, and is well known. It is manufactured in various power sizes and by a large number of manufacturers of solid state devices.

While many of the prior art systems have used a triac, they have not provided as simple and full-proof a timing means for controlling the gate on the triac as is provided in this invention.

A smaller, lower-power, triac device known as a triac driver is available on the market which has an internal control gate which is triggered by an optical pulse from a light emitting diode. Thus the input and the output of the triac driver are entirely insulated from each other, and the triac driver can be placed at the potential of the triac circuit without any interference.

The pulses which control the light emitting diode in the triac driver are derived from a second light emitting diode controlling an optically isolated transistor. This device is also an off-the-shelf item and is well known in the art. A single or multiple stage transistor can be used to provide sufficient power output to control the light emitting diode of the triac driver.

The triac driver is a small version of the triac switch, which is operated from a low voltage secondary of a transformer tied across the power line. The output of the driver can be placed directly to the potential of the power triac without any interference effects, because of the isolation of the secondary winding of the transformer and of the optical isolation between the control input and the thyristors.

The zero crossing detector is tied across the input power line which provides power to the load through the power triac. The triac driver is provided with low voltage A.C. from a secondary winding on a transformer across the power line. Once the zero crossing pulse is received by the optically isolated transistor, control of the triac driver is instituted. Then it conducts in such a direction as to provide a proper voltage on the control gate of the power triac.

However, the current flow in the reverse direction in the power triac is not possible until the lagging current, due to the inductive load, comes to zero. As soon as it does, then the open circuit voltage of the power line is impressed across the proper thyristor inside the triac, and the control voltage has been waiting for this rise of voltage to initiate conduction in the reverse direction. Thus, as soon as the current flow in one direction falls to zero, reverse conduction is initiated immediately and builds up through the inductive load, and continues for a half cycle ending sometime after the next voltage zero, and the process is then repeated.

BRIEF DESCRIPTION OF THE DRAWINGS

These and other objects and advantages of this invention and a better understanding of the principles and details of the invention will be evident from the following description, taken in conjunction with the appended drawings, in which:

FIG. 1 represents, in schematic form, apparatus for controlling an inductive load by a single power triac, through the series means of a zero voltage detector, an optically isolated transistor, and a photo electrically isolated triac driver to control the gate on the power triac.

FIG. 2 illustrates the wave forms in the power circuit.

DETAILED DESCRIPTION OF THE PREFERRED EMBODIMENT

Referring now to the drawings, and first to FIG. 1, there is a schematic diagram of one embodiment of this invention designed for controlling the power through an inductive load 70, by means of a power triac switch 40, through means of an electronic control circuit. The diagram is indicated generally by the numeral 10, and includes an input A.C. power circuit with inlet leads 12 and 14 which drives a transformer 16 having a primary winding 18, and two secondary windings, one 20 of 12 volts A.C., and the other 22, which in conjunction with a rectifier means 28 of conventional design, provides a 5 volt D.C. output on line 30.

A zero crossing detector 32 is supplied with two input leads 12" and 14', to provide power from the power lines 12, 14. On it's output, the zero crossing detector provides a sequence of short time duration voltage pulses 73 which occur precisely at the zero crossing time of the voltage between lines 12 and 14.

An optically isolated transistor, indicated generally by the numeral 36, comprises a transistor 42 operated by a photo electric detector, not shown, which is responsive to the light emitted in accordance with the arrow 44' from the light emitting diode 44. The output of the zero crossing detector 32 goes by way of lead 34 to the anode of the light emitting diode 44. The cathode of the diode 44 goes through a resistance 46 to ground 48. The collector 42A of the transistor 42 is connected by line 30 to the 5 volt D.C. output line of the rectifier 28. The emitter 42C goes by leads 50 and 50' to the light emitting diode 54 inside the triac driver. The base of the transistor is likewise connected by line 52 to the light emitting diode 54.

The pulse of light 44' from the diode 44 creates a potential on the transistor base, which causes an output voltage on the emitter 42A that initiates the operation of the light emitting diode 54 in the triac driver 38 through means of the light pulse 54'. The thyristor elements 56 of the triac driver are controlled through photo electric means, not shown, which respond to the light pulses 54' and cause the triac driver to pass sufficient current so that the output leads 61 through resistors 62 going to the control gate 66 of the power triac will enable this gate to turn on, or ignite, a proper thyristor as soon as the voltage appears across it.

While the zero crossing detector puts out a very short time pulse 73 at the zero crossing point, that pulse is applied to the transistor 36 which amplifies that pulse to the diode 54, and a pulse of light then enables a triac driver to conduct. However, from this point on, the control voltage on the gate 66 of the triac 40 is no longer a pulse, but a steady potential, waiting the short time before the voltage appears on the proper thyristor, to initiate conduction.

In other words, by the use of the triac driver there is, in a sense, a holding circuit to maintain the ability to ignite the proper thyristor element even though it may vary from one time to another because of the change of power factor of the load. In other words; whatever the power factor of the load, the triac driver maintains the ignition system in good order until the voltage does appear and the ignition can be started. Therefore, no means such as appear in much of the prior art are necessary to provide a zero lag of current, in order to avoid all difficulties. This circuit will operate whatever the power factor, even through the power factor is not known.

I have described the operation at one point in the cycle, where the direct or forward conduction is underway through the triac, and the reverse conduction is about to be initiated by the triac driver, as soon as the forward current comes to zero. Now, the operation will be repeated in the reverse direction, and so on, so that current will always be flowing in one direction, or the other, with the switching taking place at any phase with respect to the voltage that is required by the power factor of the load.

Furthermore, the current drops to zero in accordance with the voltage across the forward thyristor—the voltage being the power voltage, plus the induced voltage in the inductive load circuits. This voltage comes down to zero on a more or less monotonic decay and cannot provide any di/dt. Furthermore, the current is initiated through the reverse thyristor immediately after the forward current comes to zero, and this is at the lowest possible voltage of the power circuit. Furthermore, since the current rise instantaneously through the inductive load, current starts off on a low rise and again begins full conduction without any rapid change of voltage, that is dv/dt.

The final control of the triac is by means of the switch 60 in the ground lead of the triac driver 38, which may be mechanical or electrical.

While in FIG. 1 I have only shown a single triac control switch and a single load, it will be clear that in equipment where there is more than one inductive load, such as several drive motors or vacuum control motors or transformers and the like, the same basic circuit 10 can be multiplied twice, three times or more, as necessary, to provide the control for each of the loads separately.

While the circuit in FIG. 1 indicates that a separate triac driver is used for each power triac it is possible, of course, to use a common pulsing circuit includin the zero cross-over detector and the pulse amplifier such as the optically isolated transistor. By putting additional stages of transistor, it is possible then to load the output with two or three or more triac driver inputs, and so on.

Reference is now made to FIG. 2 which shows, on a time scale, a sine wave of voltage 80, and a corresponding wave of current 82 which is the current passing through the A.C. power circuit when the power triac 40 is delivering full power; that is, providing a continuous alternating current supply. The line 72 shows the short term peaks of voltage 73 which represent the times marked as 88, where the voltage curve 80 passes through zero, changing from negative to positive, or vice-versa.

The output of the transistor 36 would likewise be a set of peak voltage like 73 but of higher power, so as to drive the diode 54 of the triac drive 38. Once the pulse of light from the diode 54 strikes the active elements 56 of the triac drive, they now conduct a small current in the proper direction, which is supplied to the gate 66 of the power triac 40. Line 90 of FIG. 2 represents the ignition of the current carrying condition of the triac driver 36. For example, the pulse 73A will initiate current conduction to the level 92 and this will provide emission power to the triac so that when the current in the first thyristor goes to zero at time 84, the current through the triac driver 38 will be conducting in the reverse direction 94, so as to be ready to initiate conduction in the triac 40 in the reverse direction, as soon as voltage appears 86.

The photo transistor 36, or optically isolated transistor, generally has an NPN photo transistor, and a PN infrared emitting diode. They are manufactured by a number of manufacturers. Those manufactured by Motorola Semi Conductors of Phoenix Arizona are called 4N35, 4N36, 4N37.

The optically isolated triac driver 38 or opto couple, is manufactured by Motorola as MOC 3020, and MOC 3021.

The zero voltage switches 32 are manufactured by RCA Solid State Division under the designations CA 3058, CA 3059, CA 3079.

The triac switches are made in many sizes by many manufacturers such as Motorola, RCA, Texas Instruments, etc.

While the invention has been described with a certain degree of particularity, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed is:

1. An electronic switching system for inductive loads in A.C. circuits, comprising;

(a) triac switch means in series with an inductive load across an A.C. voltage and gate means for controlling ignition in said triac switch means;

(b) triac driver means with photo electric control for igniting said triac driver means, the output of which controls the potential on said gate means of said triac switch means;

(c) optically isolated transistor means for controlling the light emitting diode in said triac driver means; and (d) zero crossing detecting means for supplying short term voltage pulses to control the light emitting diode of said optically isolated transistor means;

whereby, responsive to said zero crossing detecting means, said triac driver means enables said triac switch means which conducts in the reverse direction as soon as the prior current in the forward direction drops to zero, which is at a variable time after voltage zero, dependent on the power factor of the load.

2. An electronic switching system according to claim 1 including: low voltage A.C. power means to supply power to said triac driver means, whereby said triac driver means will conduct in the proper direction as soon as the zero crossing pulse is received to enable the conduction of said triac switch means.

* * * * *